(12) United States Patent
Jeans et al.

(10) Patent No.: US 6,762,113 B2
(45) Date of Patent: Jul. 13, 2004

(54) METHOD FOR COATING A SEMICONDUCTOR SUBSTRATE WITH A MIXTURE CONTAINING AN ADHESION PROMOTER

(75) Inventors: Albert Hua Jeans, Mountain View, CA (US); Ping Mei, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/133,724

(22) Filed: Apr. 26, 2002

(65) Prior Publication Data

US 2003/0203621 A1 Oct. 30, 2003

(51) Int. Cl.$^7$ .......................... H01L 21/20; H01L 21/36
(52) U.S. Cl. ...................... 438/492; 438/493; 438/500
(58) Field of Search ................................ 438/492, 493, 438/500; 430/270.04, 273.1; 117/9

(56) References Cited

U.S. PATENT DOCUMENTS

| | | | |
|---|---|---|---|
| 4,183,839 A | 1/1980 | Gagliani | 260/37 |
| 4,590,103 A | 5/1986 | Ahne et al. | 427/387 |
| 4,604,644 A | * 8/1986 | Beckham et al. | 257/737 |
| 4,948,702 A | * 8/1990 | Wallbillich et al. | 430/271.1 |
| 5,133,840 A | 7/1992 | Buchwalter et al. | 205/167 |
| 6,288,188 B1 | 9/2001 | Godschalx et al. | 526/285 |
| 6,300,162 B1 | 10/2001 | Sheil et al. | 438/106 |

OTHER PUBLICATIONS

" Pyralin Polyimide Coatings for Electronics, VM–651 and VM–652 Adhesion Promoters." HD MicroSystems. (Nov. 1997).

" HD MicroSystems: Polyimide Properties and Applications Overview." [online] [retrieved on: Jan. 22, 2002] Retrieved from: http://www.hdmicrosystems.com/3tech/polyimid.html.

" HD Microsystems: Product Technology." [online] [retrieved on: Jan. 22, 2002] Retrieved from: http://www.hdmicrosystems.com/3tech/process.html.

" Norland Optical Adhesive 83H." [online] [retrieved on: Jan. 17, 2002] Retrieved from: http://www.norlandprod.com/adhesives/noa.83h.html.

" Silica Aerogels for Microelectronics Applications." [online] [retrieved on: Feb. 22, 2002] Retrieved from: http://www.llnl.gov/IPandC/op96/08/8i–sil.html.

Gleskova et al. "Failure Resistance of Amorphous Silicon Transistors Under Extreme In–plane Strain," Applied Physics Letters, vol. 75, No. 19. (Nov. 8, 1999) pp. 3011–3013.

Pai–Hui I. Hsu et al. " Plastic Deformation of Thin Foil Substrates With Amorphous Silicon Islands into Spherical Shapes," Mat. Res. Soc. Symp. Proc. vol. 621. (2000) pp. Q8.6.1–Q8.6.6.

* cited by examiner

Primary Examiner—W. David Coleman
Assistant Examiner—William M. Brewster

(57) ABSTRACT

A method of coating a semiconductor substrate material with a coating material consisting of the steps of mixing an adhesion promoter with a coating material and applying the mixture to a semiconductor substrate material. The invention also includes means for coating a semiconductor substrate material with a coating material comprising means for mixing adhesion promoters with coating materials and means for applying the mixture of adhesion promoters and coating materials to a semiconductor substrate.

9 Claims, 1 Drawing Sheet

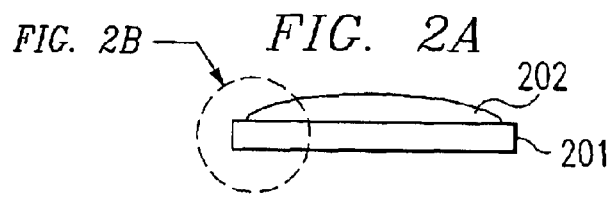
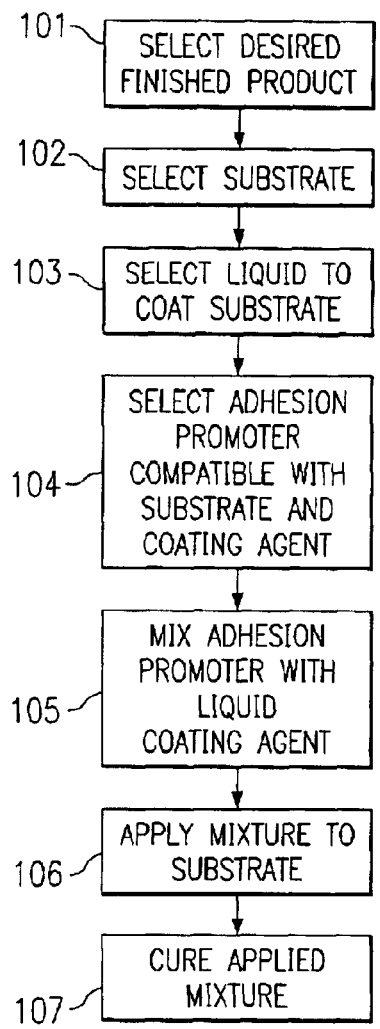
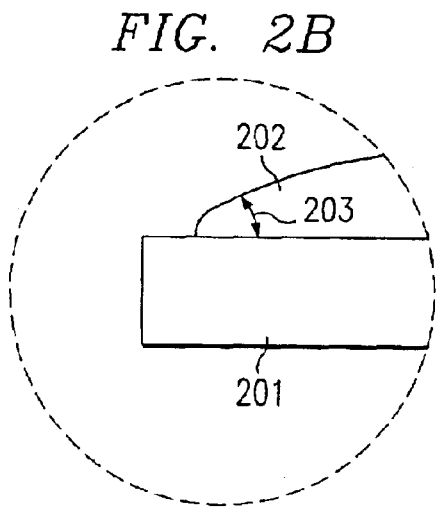
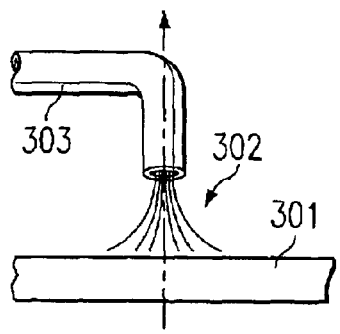
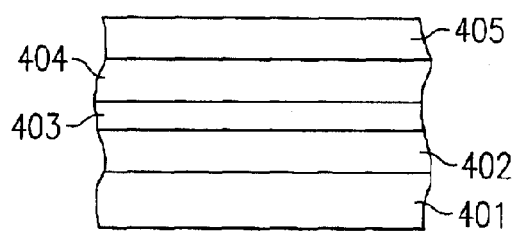

METHOD FOR COATING A SEMICONDUCTOR SUBSTRATE WITH A MIXTURE CONTAINING AN ADHESION PROMOTER

FIELD OF THE INVENTION

The present invention generally relates to adhesive promoters and coating technology.

BACKGROUND OF THE INVENTION

Coating technology applications vary from relatively simple applications having a single applied coating material, such as polyurethane applied to hardwood flooring materials to more involved applications having many layers. The semiconductor industry relies on coating technology for the fabrication of products with complex, sequentially coated layers with specific chemical or physical properties. The multi-layer coatings used in a typical semiconductor chip processing protocol typically create separate insulating layers, semiconductor layers, and conducting layers to produce electronic components, such as capacitors and transistors, on a microscopic scale. Often, these multi-layer coatings require a specific cure time and environment as each coating is sequentially applied to achieve desired characteristics.

Sequential coating manufacturing processes like those employed in semiconductor processing may suffer from inefficiency and quality control problems if too many steps are needed to produce a product. In particular, cure steps may be difficult to implement in production situations like roll-to-roll or web-based manufacturing, where a flexible sheet or roll of material is guided automatically through a series of manufacturing steps. In these types of manufacturing situations, each cure step requires that the material spend significant time in a waiting zone or accumulator while the area being cured is treated appropriately. Therefore, additional curing or manufacturing steps may require a correspondingly greater capital investment in machinery and materials, and may also result in longer manufacturing times.

SUMMARY OF THE INVENTION

A method of coating a semiconductor substrate material with a coating material consisting of the steps of mixing an adhesion promoter with a coating material and applying the mixture to a semiconductor substrate material. The invention also includes means for coating a semiconductor substrate material with a coating material comprising means for mixing adhesion promoters with coating materials and means for applying the mixture of adhesion promoters and coating materials to a semiconductor substrate.

BRIEF DESCRIPTION OF THE DRAWINGS

FIG. 1 is a flowchart of the steps performed according to one embodiment of the present invention;

FIG. 2A is a profile view of a coating applied to a semiconductor substrate;

FIG. 2B is a magnified profile view of a coating applied to a semiconductor substrate showing a contact angle formed therebetween;

FIG. 3 is a profile view of a method of applying a coating to a semiconductor substrate according to an embodiment of the present invention; and FIG. 4 is a profile view of a multi-layer product formed according to an embodiment of the present invention.

DETAILED DESCRIPTION

Coating technology is ubiquitous in a wide range of manufactured items, from paint coatings that are applied to finished articles to semiconductor processing techniques requiring complex layering systems. As a simple example, coating technology enables the application of a coating material to a semiconductor substrate material implementing a desired level of adhesion between the two materials. Often the coating process requires two separate steps, one requiring the application of an adhesive promoter to the semiconductor substrate and, only then, application of a coating layer to the treated semiconductor substrate. The coating materials and/or the semiconductor substrate materials may be either homogenous or heterogeneous chemical compositions.

FIG. 1 is a flow chart of the steps performed according to one embodiment of the invention. Generally, the method contemplates a series of four selection steps 101, 102, 103, and 104 followed by a mixing step 105 and an application step 106. The selection steps 101–104 select the desired properties of a finished product and materials required to generate the finished product. Following the four selection steps 101–104, step 105 defines mixing the adhesion promoter identified in step 104 with the coating material identified in step 103. In step 106, the mixture produced in step 105 is applied to a selected semiconductor substrate, and the applied mixture is cured, if necessary, in step 107.

Specifically, in step 101, the coating properties required for the finished product of the invention are selected. For example, a coating with protective characteristics may be selected in step 101 on the basis of its functional ability to protect the underlying semiconductor substrate from damage. In other examples, a coating may be selected in step 101 for particular electrical properties such as insulation performance, or for aesthetic properties that provide an attractive finish to a substrate.

Step 102 identifies a semiconductor substrate material for use with the invention. Semiconductor substrates include materials that are electrical conductors under certain conditions, such as when an electrical or magnetic field is applied. Semiconductor substrates may also combine semiconductor materials with materials that do not act as semiconductors. Typical semiconductor substrates may include homogenous and heterogeneous materials, such as metals, plastics, non-metals, glass, or ceramics. More specifically, semiconductor substrates such as silicon, silicon dioxide, silicon nitride, and aluminum compounds may be used in embodiments of the present invention. In other embodiments of the invention, flexible silicon semiconductor substrates, such as flexible silicon-coated webs are used. In the preferred embodiment illustrated by FIG. 1, the substrate selected is a semiconductor substrate, typical in semiconductor fabrication. Note that many other substrates are suitable for use with the method.

In step 103, a liquid coating material is identified. Specific examples of suitable coating materials are coating agents, photopolymers, photoinitiators, acrylics, polyurethanes, glues, inks, adhesives, and paints. The liquid coating material may be a single compound or a composition, or it may be a homogeneous or heterogeneous solution of two or more compounds or compositions. In one embodiment, the coating material may be made of polyurethane, acrylate, and a photoinitiator such as 2,2-dimethoxy-1,2-diphenylethan-1. In a preferred embodiment, the coating material may be a photopolymer material with mercapto-ester in solution, specifically a UV-curable polymeric monomer adhesive as set forth in the publication of Norland Products, Inc. Norland UV Curing Adhesives, incorporated herein in its entirety by reference. Norland NOA83H is a preferred UV-curable liquid coating. Note, however that many other coatings are suitable for use with the method.

In step 104, an adhesion promoter is identified that is compatible with both the semiconductor substrate identified in step 102 and the coating material identified in step 103. Compatible adhesion promoters are miscible with the liquid coating material identified in step 103 and retain or enhance the coating material's desired properties. The adhesion promoter may be selected from a wide variety of materials and compounds including, but not limited to, organosilanes, acrylics, and epoxies. In one embodiment, the selected adhesion promoter is applied separately from the coating material. The preferred embodiment uses an α-amino propyltriethoxysilane in organic solution as the adhesion promoter. The α-amino propyltriethoxysilane is the active ingredient in DuPont Co's organosilanes marketed by HD MicroSystems under the order number VM-652. HD MircoSystems VM-652 is a preferred adhesion promoter.

The adhesion promoter selection criteria may also be based on the ability of the adhesion promoter to enhance the wettability of the selected semiconductor substrate material in relation to the selected coating material. A wettable semiconductor substrate material enables a liquid coating material to spread evenly and uniformly across the semiconductor substrate, a desirable property in most applications utilizing the method.

FIG. 2A is a profile view of a semiconductor substrate 201 coated with a coating mixture 202. FIG. 2B is a magnified profile view of the semiconductor substrate 201 coated with the coating mixture 202. The wettability of a semiconductor substrate in relation to an applied liquid coating is proportional to the contact angle 203, formed by the surface of the semiconductor substrate 201 and the surface of the liquid phase coating 202. Generally, wettable surfaces form small contact angles 203 with applied liquid coatings, and adhesion promoters are selected in step 104 to minimize the substrate-coating contact angle 203 when mixed with the liquid coating.

Returning to FIG. 1, in step 105, the liquid coating identified in step 103 is mixed with the adhesion promoter identified in step 104. The mixture may also include any of a variety of organic and inorganic solvents, such as water, alcohols, ethers, ketones, or hydrocarbons. A variety of mixing techniques may be employed to mix the liquid coating and the adhesion promoter, including, but not limited to such means as mechanical stirring, shaking, or churning. However, the embodiment contemplated by FIG. 1 mixes the liquid coating with the adhesion promoter by stirring to obtain a homogenous mixture or colloid of coating and adhesion promoter.

In step 106, the mixture formed in step 105 is applied to the semiconductor substrate identified in step 102. A variety of application methods are contemplated by the method, including steps such as pouring, spreading, spraying, extruding, or trowling the mixture onto the semiconductor substrate. The semiconductor substrate may also be immersed in the mixture. The method also contemplates specific application methods including, but not limited to the use of metering rods or bars, gravure application technology, curtain coating, gap coating or web coating. An implicit commonality to these coating techniques is that the material is to be applied to substantially the entire surface of the semiconductor substrate including the central portion of the substrate surface. The application process may take place in a wide range of environmental conditions, including for example, vacuum, high or low temperatures, or low particulate or pressurized environments. In one embodiment, the mixture formed in step 105 is applied to the semiconductor substrate selected in step 102 using spin coating technology.

In step 107, the applied mixture is subjected to a curing step. In the embodiment contemplated in FIG. 1, the applied coating mixture may be exposed to an ultraviolet light source that may induce polymerization of a photopolymer contained in the coating mixture. In other embodiments, the curing step may employ a light source of a different wavelength than ultraviolet, or may employ heating or cooling to cure the coating mixture. Some coating mixtures may not require curing in step 107.

FIG. 3 illustrates the use of a spin coating application technique to apply the mixture from step 105 to the semiconductor substrate selected in step 102. Spin coating is used in the preferred embodiment as a means to apply a mixture of coating material and adhesion promoter to a semiconductor substrate. The semiconductor substrate 301 may be disc-shaped, but could assume a variety of shapes conditioned on their ability to be made to stably revolve around a vertical axis. The mixture 302 may be applied to a revolving semiconductor substrate using an applicator nozzle 303. The semiconductor substrate 301 may be spun at a variety of different rotational speeds; typically ranges are from 10 revolutions per minute to 10,000 revolutions per minute. Rotation is performed until the desired film thickness is achieved. The centrifugal forces involved in spin coating insure the entire surface of the substrate, including the center portion of the substrate surface, receive a coating of the mixture.

FIG. 4 shows a cross section of an exemplary final product of the invention, illustrating a semiconductor substrate 401 coated with four layers. In the preferred embodiment, layer 402 is a coating layer comprised of polyimide mixed with adhesion promoter. The number and composition of layers 403, 404, and 405 vary according to the desired product of the invention, and may include layers with specific physical properties such as insulators, conductors, semiconductors, dielectric or protective layers. As shown in FIG. 4 the coating layers (402, 403, 404, and 405) are substantially uniform and continuous across the surface of substrate 401. As FIG. 4 presents a cross section portion of the semiconductor substrate 401, it is to be understood and appreciated that the cross section portion is substantially representative of any cross section portion of the substrate 401, including the center. More specifically, any given layer of coating material (402, 403, 404, 405) is uniform and continuous across the entire surface of substrate 401. Note that the method may be used to apply multiple layers on a semiconductor substrate, as in FIG. 4, or may be used to apply a single layer of coating material.

In summary, the present invention provides a method of coating a semiconductor substrate material with a coating material using a minimum of separate steps. Note that the present invention is easily implemented utilizing any of a variety of components and tools existing in the art. Moreover, while the present invention has been described by reference to specific embodiments, it will be apparent that other alternative embodiments and methods of implementation or modification may be employed without departing from the true spirit and scope of the invention. For example, while the present invention finds particular application to the fabrication of electronic components such as integrated circuits, it is equally applicable to other devices and to a broad range of surfaces requiring a coating to be applied using an adhesion promoter.

What is claimed is:

1. A method of coating the surface of a semiconductor substrate material with a coating material comprising:

mixing an α-amino propyltriethoxysilane in organic solution with a photopolymer material with mercapto-ester in solution to form a coating mixture; and applying the coating mixture to substantially the entire surface of said semiconductor substrate material, inclusive of the center portion of the substrate surface.

2. The method of claim 1 further comprising:

selecting an adhesion promoter that is compatible with both the semiconductor substrate material and the coating mixture.

3. The method of claim 1 further comprising:

selecting properties required of a final product;

and selecting a semiconductor substrate material and a coating mixture provide said properties.

4. The method of claim 3 further comprising:

selecting an adhesion promoter that is compatible with said semiconductor substrate material and said coating mixture.

5. The method of claim 1 wherein said coating material is a liquid.

6. The method of claim 1 wherein said semiconductor substrate material is a flexible web.

7. The method of claim 2 wherein the compatibility of said adhesion promoter is identified by reference to the contact angle of a liquid-solid interface.

8. A method of coating the surface of a semiconductor substrate comprising:

mixing an α-amino propyltriethoxysilane in organic solution with a photopolymer material with mercapto-ester in solution to form a costing mixture;

applying said mixture to substantially the entire surface of the semiconductor substrate.

9. The method of coating the surface of a semiconductor substrate comprising:

mixing an α-amino propyltriethoxysilane in organic solution with a photopolymer material with mercapto-ester in solution to form a coating mixture;

spin coating substantially the entire surface of said semiconductor substrate with said coating mixture to form a coated semiconductor substrate; and subjecting said coated semiconductor substrate to an ultraviolet light source so as to cure said coating mixture.

* * * * *